United States Patent
Takahara et al.

(10) Patent No.: US 10,274,943 B2
(45) Date of Patent: Apr. 30, 2019

(54) ARTICLE TRANSPORT FACILITY

(71) Applicant: Daifuku Co., Ltd., Osaka-shi (JP)

(72) Inventors: Masahiro Takahara, Hinocho (JP);
Tomoaki Nishikawa, Hinocho (JP);
Tsuyoshi Uemura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/891,693

(22) Filed: Feb. 8, 2018

(65) Prior Publication Data
US 2018/0224839 A1 Aug. 9, 2018

(30) Foreign Application Priority Data

Feb. 8, 2017 (JP) .................. 2017-021572

(51) Int. Cl.
| | |
|---|---|
| *G06F 7/00* | (2006.01) |
| *G05B 19/418* | (2006.01) |
| *B65G 47/61* | (2006.01) |
| *H01L 21/677* | (2006.01) |
| *B61B 3/02* | (2006.01) |

(52) U.S. Cl.
CPC ....... *G05B 19/41895* (2013.01); *B65G 47/61* (2013.01); *B61B 3/02* (2013.01); *G05B 2219/31002* (2013.01); *G05B 2219/31422* (2013.01); *H01L 21/6773* (2013.01); *H01L 21/67724* (2013.01); *Y02P 90/02* (2015.11)

(58) Field of Classification Search
None
See application file for complete search history.

(56) References Cited

U.S. PATENT DOCUMENTS

| 9,086,697 B2 | 7/2015 | Suzuki | |
|---|---|---|---|
| 2006/0148063 A1* | 7/2006 | Fauzzi | G01N 1/31 435/286.4 |

FOREIGN PATENT DOCUMENTS

JP 201330003 A 2/2013

\* cited by examiner

*Primary Examiner* — Yolanda R Cumbess
(74) *Attorney, Agent, or Firm* — The Webb Law Firm

(57) ABSTRACT

A control system for controlling transport devices includes a first server that has a first storage unit and a first instruction unit, and a second server that has a second storage unit and a second instruction unit. In a first state, the first storage unit transmits first transport information to the first instruction unit, the first instruction unit transmits second transport information to a target transport device, and instruction unit information is stored in common in the first instruction unit and the second instruction unit. If the first instruction unit stops operating normally in the first state, the control state is switched to a second state, and in the second state, the first storage unit transmits the first transport information to the second instruction unit, and the second instruction unit transmits the second transport information to the target transport device based on the instruction unit information.

6 Claims, 8 Drawing Sheets

ARTICLE TRANSPORT FACILITY

CROSS-REFERENCE TO RELATED APPLICATION

This application claims priority to Japanese Patent Application No. 2017-021572 filed Feb. 8, 2017, the disclosure of which is hereby incorporated in its entirety by reference.

BACKGROUND OF THE INVENTION

1. Field of the Invention

The present invention relates to an article transport facility that includes a control system for controlling transport devices that transport articles.

2. Description of the Related Art

An example of the above-described article transport facility is described in JP 2013-030003A (Patent Document 1). The article transport facility in Patent Document 1 includes a control system (transport controller HC) that receives first transport information transmitted by a management device (high-order controller JC), and this control system is configured to be able to select a target transport device from a plurality of transport devices based on the first transport information from the management device and device information indicating the statuses of the transport devices, and to transmit second transport information to the target transport device. Upon receiving the second transport information, the target transport device operates so as to transport articles based on the second transport information.

However, with the article transport facility in Patent Document 1, if a portion of the control system such as the application for selecting the target transport device terminates abnormally, the second transport information cannot be transmitted to the target transport device, and there is a risk that the transport of articles by the transport devices will stop. Also, it is conceivable that when an abnormality occurs in the control system in this way, due to the fact that the control system can no longer accept the first transport information, or due to the management device detecting the abnormality in the control system, the management device stops transmitting the first transport information to the control system, first transport information that is to be transmitted to the control system accumulates in the management device, and the load on the management device increases.

SUMMARY OF THE INVENTION

In view of this, there is desire to realize an article transport facility in which even if an abnormality occurs in the control system, second transport information can continue to be transmitted to transport devices, and an increase in the load on the management device can be avoided.

An article transport facility according to one aspect of the present disclosure includes: a control system that controls a plurality of transport devices that transport an article, wherein the control system is mechanically separated from a management device and includes a first server and a second server that transmit second transport information to the plurality of transport devices based on first transport information from the management device, the first server includes a first storage unit and a first instruction unit, the second server is mechanically separated from the first server and includes a second storage unit and a second instruction unit, the first storage unit is configured to be capable of receiving the first transport information from the management device and storing the first transport information, and transmitting the first transport information to the first instruction unit and the second instruction unit, the second storage unit is configured to be capable of receiving the first transport information from the management device and storing the first transport information, and transmitting the first transport information to the first instruction unit and the second instruction unit, the first instruction unit is configured to be capable of selecting a target transport device from among the plurality of transport devices based on the first transport information from the first storage unit or the second storage unit and device information indicating statuses of the plurality of transport devices, and transmitting the second transport information to the target transport device, the second instruction unit is configured to be capable of selecting the target transport device based on the first transport information and the device information, and transmitting the second transport information to the target transport device, a control state of the control system includes a first state in which based on the first transport information received by the first storage unit, out of the first instruction unit and the second instruction unit, the first instruction unit transmits the second transport information to the target transport device, and a second state in which based on the first transport information received by the first storage unit, out of the first instruction unit and the second instruction unit, the second instruction unit transmits the second transport information to the target transport device, in a state where the first storage unit and the first instruction unit are operating normally, the control state is the first state, and in a case where the first instruction unit stops operating normally in the first state but the second instruction unit is operating normally, the control state is switched to the second state, in the first state, the first storage unit transmits the first transport information to the first instruction unit, the first instruction unit transmits the second transport information to the target transport device based on the device information and the first transport information, and the device information and the first transport information are transmitted to the second instruction unit, and thus instruction unit information is stored in common in the first instruction unit and the second instruction unit, and in the second state, the first storage unit transmits the first transport information to the second instruction unit, and the second instruction unit transmits the second transport information to the target transport device based on the instruction unit information.

According to this configuration, in the control system in the first state, the first storage unit transmits the first transport information received from the management device to the first instruction unit, and the first instruction unit can select the target transport device from among the plurality of transport devices based on the first transport information from the first storage unit and the device information that indicates the statuses of the transport devices, and transmit the second transport information to the target transport device. Also, in the control system in the first state, the device information and the first transport information are transmitted to the second instruction unit as well, and therefore the instruction unit information (information including the device information and the first transport information) can be stored in common in the first instruction unit and the second instruction unit.

Also, if an abnormality occurs in the first instruction unit while the control system is operating in the first state, the control state of the control system is switched from the first state to the second state, and thus the second instruction unit transmits the second transport information to the target transport device based on the instruction unit information. In other words, as described above, even if an abnormality occurs in the first instruction unit, the second instruction unit can transmit the second transport information to the target transport device, thus making it possible to avoid a stop in article transport by the transport devices.

Also, in the control system, first transport information can be received from the management device both when the control state is in the first state and when it is in the second state, thus making it possible to avoid an increase in the load on the management device caused when first transport information that is to be transmitted to the control system accumulates in the management device.

It should be noted that there are cases where initially after the control state of the control system switches from the first state to the second state, the second instruction unit has not received new first transport information and device information after the switch to the second state, and in this case, the second instruction unit can select a target article transport vehicle based on the instruction unit information that was stored in common in the first state, and transmit the second transport information to the target article transport vehicle.

After the control state of the control system switches from the first state to the second state, if the second instruction unit has received first transport information and device information that enable selecting a target article transport vehicle and transmitting the second transport information to the target article transport vehicle, similarly to the first instruction unit in the first state, the second instruction unit can select a target article transport vehicle based on the first transport information and the device information that were received after the switch to the second state, and transmit the second transport information to the target article transport vehicle.

DETAILED DESCRIPTION OF PREFERRED EMBODIMENTS

1. Embodiment

Hereinafter, an embodiment of an article transport facility will be described with reference to the drawings.

Figure 1:
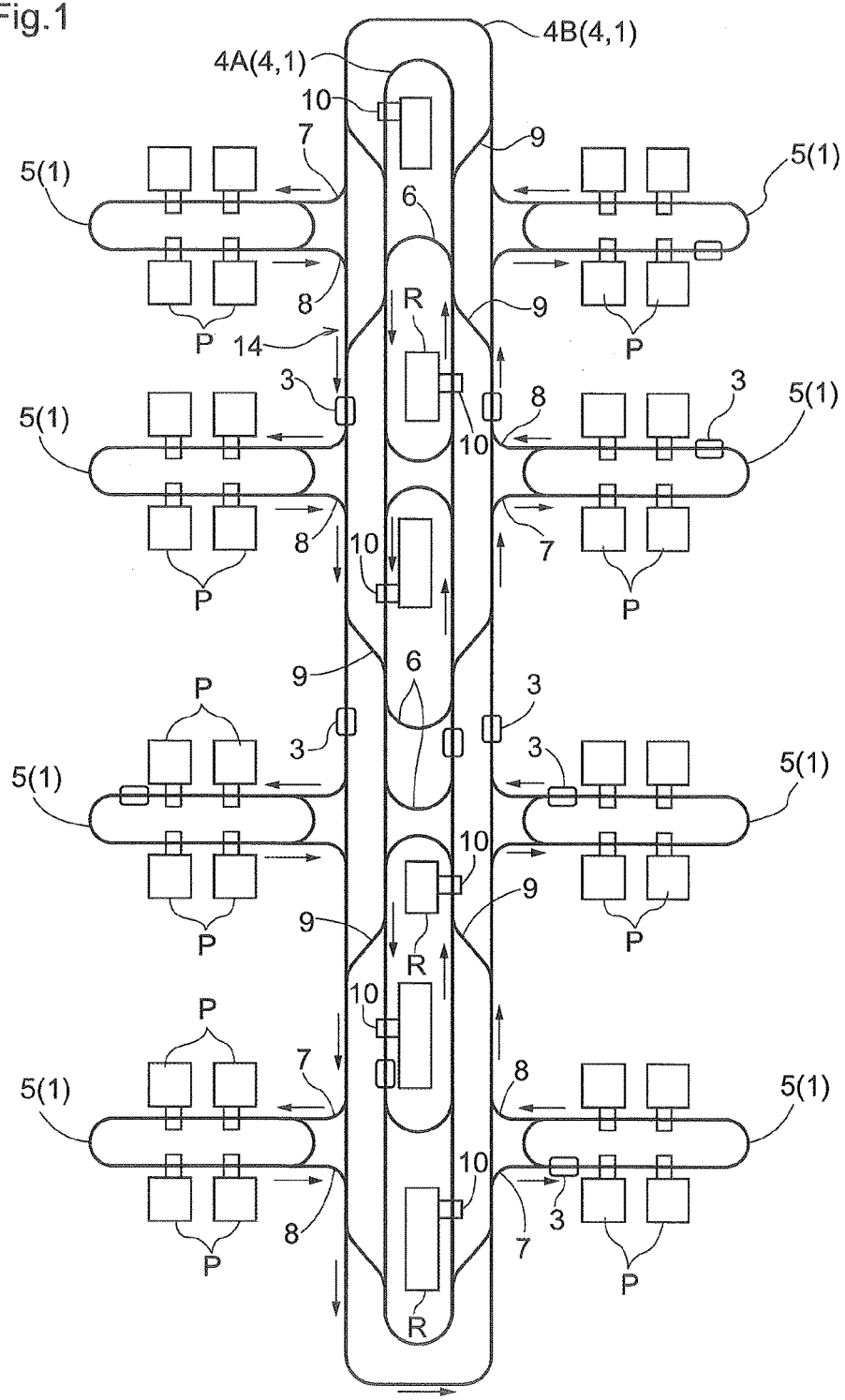
FIG. 1 is a plan view of an article transport facility.

As shown in FIG. 1, the article transport facility includes article transport vehicles 3 that travel along a traveling path 1 on a traveling rail 2 (see FIG. 2) that is disposed along the traveling path 1, and automated warehouses R in which articles are stored. The traveling rail 2 is disposed in the vicinity of the ceiling, and the article transport vehicles 3 transport articles by traveling along the traveling rail 2. Note that the article transport vehicles 3 correspond to transport devices (ceiling transport vehicles) that transport articles. Also, in the present embodiment, the articles transported by the article transport vehicles 3 are FOUPs (Front Opening Unified Pods) in which semiconductor substrates are stored.

As shown in FIG. 1, the traveling path 1 includes two main paths 4 and multiple sub paths 5 that pass through article processing units P. The two main paths 4 and the sub paths 5 each have a loop shape.

The two main paths 4 are provided in a state of forming a double loop. The two loop-shaped main paths 4 are paths along which the article transport vehicles 3 travel in the same direction (counter-clockwise direction). Note that in FIG. 1, the traveling direction of the article transport vehicles 3 is indicated by arrows.

Out of the two main paths 4, the main path 4 on the inner side will be referred to as a first main path 4A, and the main path 4 on the outer side will be referred to as a second main path 4B in the following description.

The first main path 4A is set so as to pass through multiple automated warehouses R. The first main path 4A is used as an article transfer path along which article transport vehicles 3 are stopped in order to transfer articles to/from an automated warehouse R, and the second main path 4B is used as a continuous travel path along which the article transport vehicles 3 are allowed to travel continuously.

The traveling path 1 includes shortcut paths 6, branching paths 7, merging paths 8, and transit paths 9.

Each shortcut path 6 connects a pair of portions of the first main path 4A that are parallel to each other and extend in a straight line. The shortcut path 6 is a path for allowing an article transport vehicle 3 to travel from one of the two straight portions of the first main path 4A to the other one, or vice-versa.

Each branching path 7 is connected to the second main path 4B and one sub path 5, and is a path for allowing an article transport vehicle 3 to travel from the second main path 4B to that sub path 5. Each merging path 8 is connected to one sub path 5 and the second main path 4B, and is a path for allowing an article transport vehicle 3 to travel from that sub path 5 to the second main path 4B.

Each transit path 9 is connected to the first main path 4A and the second main path 4B, and is a path for allowing an article transport vehicle 3 to travel from the first main path 4A to the second main path 4B, or from the second main path 4B to the first main path 4A.

Each article transport vehicle 3 is configured to be capable of exchanging articles with an article processing unit P while stopped at a position corresponding to the article processing unit P, and is configured to be capable of exchanging articles with an automated warehouse R while stopped at a position corresponding to the automated warehouse R. One of the article processing units P or the automated warehouses R serves as a transport source, one of the remaining article processing units P or automated warehouses R serves as a transport destination, and the article transport vehicle 3 transports articles from the transport source to the transport destination.

Although the automated warehouses R will not be described in detail, they each include a transport conveyor, a stacker crane, and an article storage shelf. The article storage shelf has multiple storage units in which articles are stored. An article received by an automated warehouse R from an article transport vehicle 3 (ceiling transport vehicle) is supported on an incoming/outgoing unit 10, and the automated warehouse R transports the article from the incoming/outgoing unit 10 to one of the storage units with use of the transport conveyor and the stacker crane. The automated warehouse R also transports an article stored in a storage unit of the article storage shelf to the incoming/outgoing unit 10 with use of the stacker crane and the transport conveyor.

Figure 2:
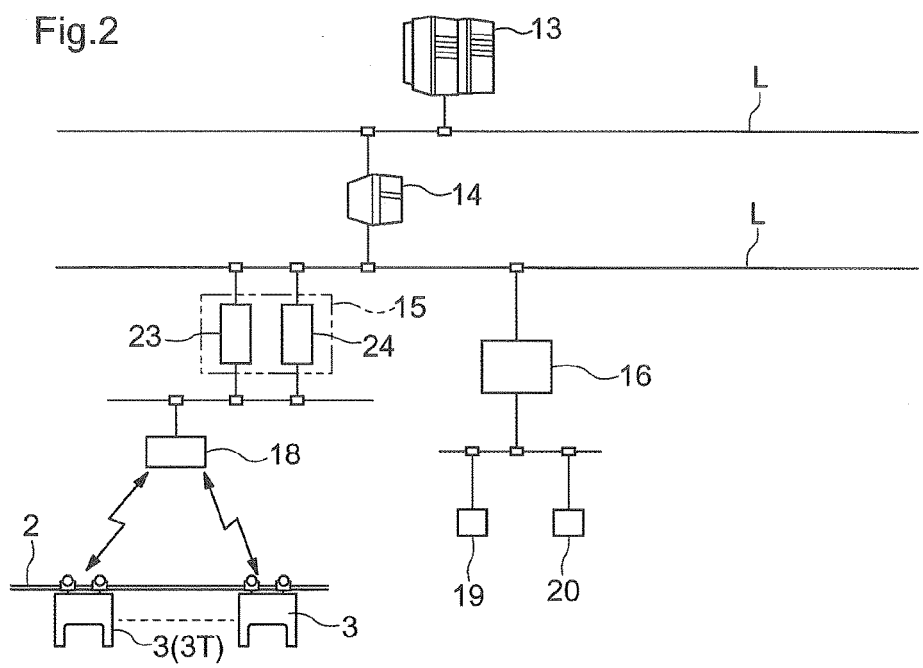
FIG. 2 is a diagram showing a communication configuration of the article transport facility.

As shown in FIG. 2, the article transport facility includes a high-order management device 13, a low-order management device 14, a transport vehicle control system 15, and a warehouse control system 16. The high-order management device 13, the low-order management device 14, the transport vehicle control system 15, and the warehouse control system 16 are mechanically separated from each other. The high-order management device 13 and the low-order management device 14 are connected to each other by a communication line L, and information can be exchanged between the high-order management device 13 and the low-order management device 14 in this configuration. Also, the low-order management device 14 is connected to the transport vehicle control system 15 and the warehouse control system 16 by the communication line L, and information can be exchanged between the low-order management device 14 and the transport vehicle control system 15 and warehouse control system 16 in this configuration. Note that the transport vehicle control system 15 corresponds to a control system that controls article transport vehicles 3 (transport devices) that transport articles. Also, the low-order management device 14 corresponds to a management device that transmits first transport information to the transport vehicle control system 15.

The high-order management device 13 transmits transport information indicating an article transport source and a transport destination to the low-order management device 14. Specifically, for example, one of the article processing units P serves as the transport source, a storage unit storing a transported article in one of the automated warehouses R serves as the transport destination, and information indicating the transport source and the transport destination is transmitted to the low-order management device 14 as transport information.

One of the article processing units P or the automated warehouses R serves as a first transport source, one of the remaining article processing units P or automated warehouses R serves as a first transport destination, and the low-order management device 14 transmits first transport information indicating the first transport source and the first transport destination to the transport vehicle control system 15. Specifically, for example, the article processing unit P indicated as the transport source in the transport information serves as the first transport source, the automated warehouse R that has the storage unit indicated as the transport destination in the transport information serves as the first transport destination, and the low-order management device 14 transmits first transport information indicating the first transport source and the first transport destination to the transport vehicle control system 15. In this way, based on the transport information, the low-order management device 14 sets the first transport source and the first transport destination within the transport capability of the article transport vehicle 3, and transmits the first transport information indicating the first transport source and the first transport destination to the transport vehicle control system 15.

Also, one of the incoming/outgoing units 10 or the storage units serves as a second transport source, one of the remaining incoming/outgoing units 10 or storage units serves as a second transport destination, and the low-order management device 14 transmits third transport information indicating the second transport source and the second transport destination to the warehouse control system 16. Specifically, for example, an incoming/outgoing unit 10 serves as the second transport source, the storage unit indicated as the transport destination in the transport information serves as the second transport destination, and the low-order management device 14 transmits third transport information indicating the second transport source and the second transport destination to the warehouse control system 16.

The article transport facility includes multiple wireless communication units 18. The transport vehicle control system 15 is connected to the wireless communication units 18 by the communication line L, and information can be exchanged between the transport vehicle control system 15 and the wireless communication units 18 in this configuration. Also, the article transport vehicles 3 are configured to be capable of wireless communication with the wireless communication units 18. In other words, the transport vehicle control system 15 is configured to be capable of exchanging information with the article transport vehicles 3 via the communication line L and the wireless communication units 18.

Based on the first transport information from the low-order management device 14, the transport vehicle control system 15 transmits the second transport information to the article transport vehicles 3 (specifically, one article transport vehicle 3 selected from among the article transport vehicles 3). The second transport information is information indicating the first transport source and the first transport destination (information including at least information regarding the first transport source and information regarding the first transport destination). The transport vehicle control system 15 also receives device information transmitted by the article transport vehicles 3. This device information is information indicating the position information of an article transport vehicle 3, indicating that the transport of an article by an article transport vehicle 3 in accordance with the second transport information is complete, or the like. It should be noted that an article transport vehicle 3 that has received the second transport information operates so as to transport an article from the first transport source to the first transport destination.

Each automated warehouse R includes a conveyor control unit 19 that controls the transport conveyor, and a crane control unit 20 that controls the stacker crane. The warehouse control system 16 is connected to the conveyor control unit 19 and the crane control unit 20 by the communication line L, and information can be exchanged between the warehouse control system 16 and the conveyor control unit 19 and crane control unit 20 in this configuration. The warehouse control system 16 transmits information to the conveyor control unit 19 and the crane control unit 20 based on third control information from the low-order management device 14. Upon receiving information from the warehouse control system 16, the conveyor control unit 19 and the crane control unit 20 control the transport conveyor and the stacker crane so as to transport an article from the second transport source to the second transport destination.

Next, the transport vehicle control system 15 will be described.

Figure 3:
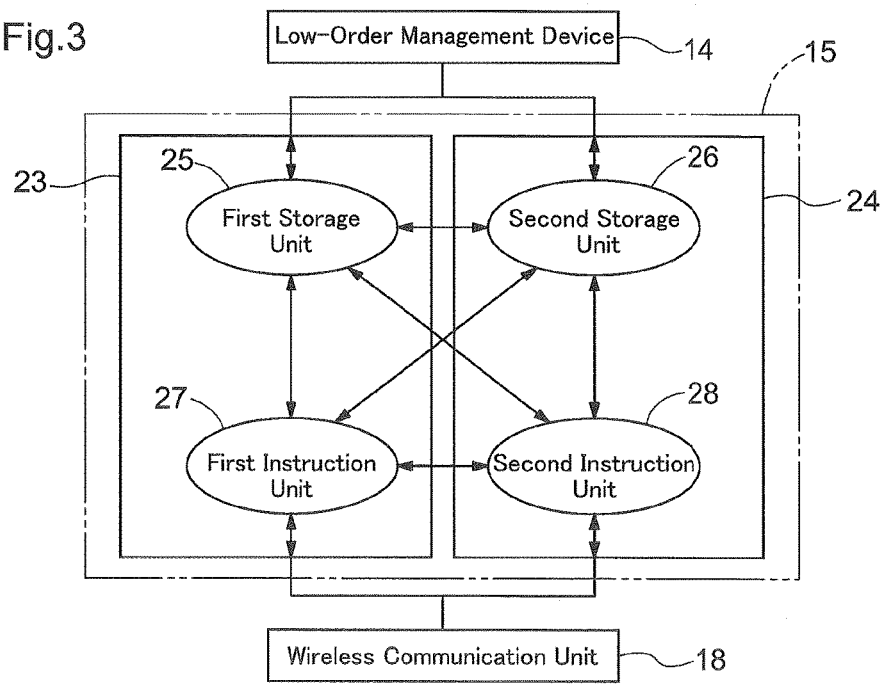
FIG. 3 is a diagram showing a transport vehicle control system.

As shown in FIG. 3, the transport vehicle control system 15 includes a first server 23 and a second server 24. The first server 23 is configured to be capable of transmitting the second transport information to the article transport vehicles 3 based on the first transport information from the low-order management device 14. Similarly to the first server 23, the second server 24 is also configured to be capable of transmitting the second transport information to the article transport vehicles 3 based on the first transport information from the low-order management device 14.

The low-order management device 14 transmits the first transport information to both the first server 23 and the second server 24. Also, the first server 23 and the second server 24 transmits various types of information, such as device information, to the low-order management device 14.

The first server 23 includes a first storage unit 25 and a first instruction unit 27. The second server 24 is mechanically separated from the first server 23, and includes a second storage unit 26 and a second instruction unit 28. More specifically, the first server 23 has a two-layer application structure including a storage unit layer and an instruction unit layer, where the first storage unit 25 is provided in the storage unit layer of the first server 23, and the first instruction unit 27 is provided in the instruction unit layer of the first server 23. Also, similarly to the first server 23, the second server 24 also has a two-layer application structure including a storage unit layer and an instruction unit layer, where the second storage unit 26 is provided in the storage unit layer of the second server 24, and the second instruction unit 28 is provided in the instruction unit layer of the second server 24.

The first storage unit 25 and the second storage unit 26 are connected to the low-order management device 14 via the communication line L, and are configured to be capable of exchanging information with the low-order management device 14. The first instruction unit 27 and the second instruction unit 28 are connected to wireless communication units 18 via the communication line L, and are configured to be capable of exchanging information with the article transport vehicles 3.

Also, the first storage unit 25 and the first instruction unit 27 are configured to be capable of exchanging information in the first server 23, and the second storage unit 26 and the second instruction unit 28 are configured to be capable of exchanging information in the second server 24. Furthermore, the first server 23 and the second server 24 are communicably connected by a line (not shown), and information can be exchanged between the first storage unit 25 and the second storage unit 26, between the first storage unit 25 and the second instruction unit 28, between the first instruction unit 27 and the second storage unit 26, and between the first instruction unit 27 and the second instruction unit 28 in this configuration.

The first storage unit 25 transmits the first transport information to the first instruction unit 27 and the second instruction unit 28, the first instruction unit 27 transmits response information indicating the reception of the first transport information from the first storage unit 25 to the first storage unit 25, and the second instruction unit 28 transmits response information indicating the reception of the first transport information from the first storage unit 25 to the first storage unit 25. After the first storage unit 25 transmits the first transport information to the first instruction unit 27, if response information is not received from the first instruction unit 27 within a certain time, the first storage unit 25 determines that communication with the first instruction unit 27 has been interrupted, and that the first instruction unit 27 stopped operating normally. Also, after the first storage unit 25 transmits the first transport information to the second instruction unit 28, if response information is not received from the second instruction unit 28 within a certain time, the first storage unit 25 determines that communication with the second instruction unit 28 has been interrupted, and that the second instruction unit 28 stopped operating normally.

Also, the first storage unit 25 transmits device information to the second storage unit 26, and the second storage unit 26 transmits response information indicating the reception of the device information from the first storage unit 25 to the first storage unit 25. After the first storage unit 25 transmits the device information to the second storage unit 26, if response information is not received from the second storage unit 26 within a certain time, the first storage unit 25 determines that communication with the second storage unit 26 has been interrupted, and that the second storage unit 26 stopped operating normally.

Similarly, after the second storage unit 26 transmits the first transport information to the first instruction unit 27, if response information is not received from the first instruction unit 27 within a certain time, the second storage unit 26 determines that communication with the first instruction unit 27 has been interrupted, and that the first instruction unit 27 stopped operating normally. After the second storage unit 26 transmits the first transport information to the second instruction unit 28, if response information is not received from the second instruction unit 28 within a certain time, the second storage unit 26 determines that communication with the second instruction unit 28 has been interrupted, and that the second instruction unit 28 stopped operating normally. After the second storage unit 26 transmits the device information to the first storage unit 25, if response information is not received from the first storage unit 25 within a certain time, the second storage unit 26 determines that communication with the first storage unit 25 has been interrupted, and that the first storage unit 25 stopped operating normally.

The first storage unit 25 is configured to be capable of receiving the first transport information from the low-order management device 14 and storing it, and also transmitting the first transport information to the first instruction unit 27 and the second instruction unit 28.

The second storage unit 26 is configured to be capable of receiving the first transport information from the low-order management device 14 and storing it, and also transmitting the first transport information to the first instruction unit 27 and the second instruction unit 28.

The first instruction unit 27 is configured to be capable of selecting a target article transport vehicle 3T from among the article transport vehicles 3 based on the first transport information from the first storage unit 25 or the second storage unit 26 and the device information that indicates the statuses of the article transport vehicles 3, and capable of transmitting the second transport information to the target article transport vehicle 3T.

The second instruction unit 28 is configured to be capable of selecting a target article transport vehicle 3T based on the first transport information and the device information, and transmitting the second transport information to the target article transport vehicle 3T.

Figure 10:
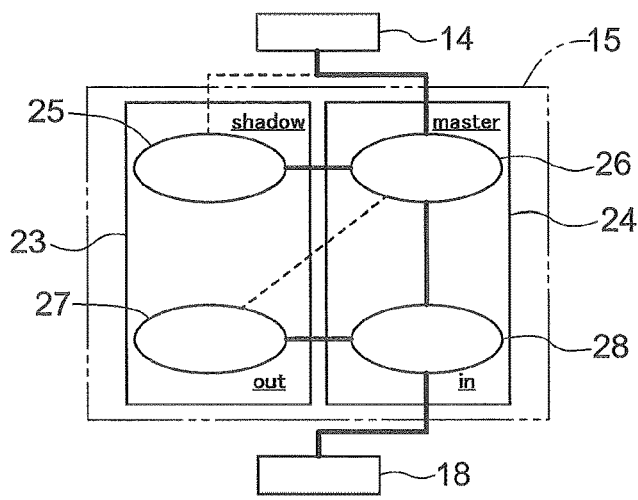
FIG. 10 is a diagram showing the transport vehicle control system in a fourth state.

The control state of the transport vehicle control system 15 includes a first state (see FIG. 4), a second state (see FIG. 6), a third state (see FIG. 8), and a fourth state (see FIG. 10).

Figure 4:
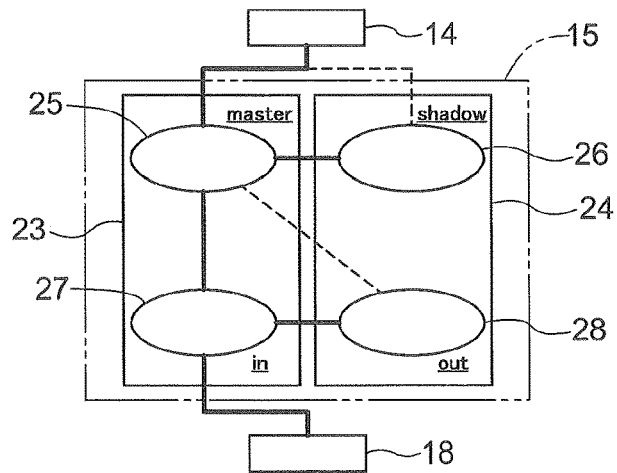
FIG. 4 is a diagram showing the transport vehicle control system in a first state.
Figure 6:
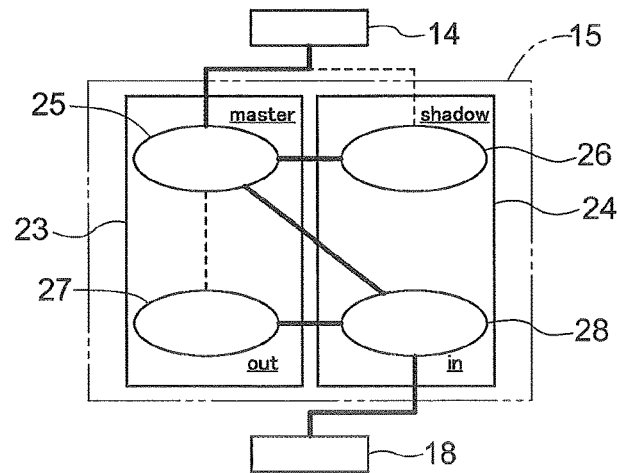
FIG. 6 is a diagram showing the transport vehicle control system in a second state.
Figure 8:
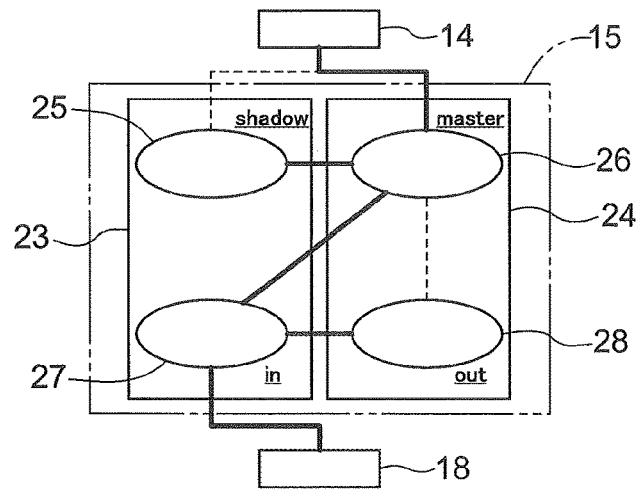
FIG. 8 is a diagram showing the transport vehicle control system in a third state.

As shown in FIG. 4, in the first state, based on the first transport information received by the first storage unit 25, out of the first instruction unit 27 and the second instruction unit 28, the first instruction unit 27 transmits the second transport information to the target article transport vehicle 3T. As shown in FIG. 6, in the second state, based on the first transport information received by the first storage unit 25, out of the first instruction unit 27 and the second instruction unit 28, the second instruction unit 28 transmits the second transport information to the target article transport vehicle 3T. As shown in FIG. 8, in the third state, based on the first transport information received by the second storage unit 26, out of the first instruction unit 27 and the second instruction unit 28, the first instruction unit 27 transmits the second transport information to the target article transport vehicle 3T. As shown in FIG. 10, in the fourth state, based on the first transport information received by the second storage unit 26, out of the first instruction unit 27 and the second instruction unit 28, the second instruction unit 28 transmits the second transport information to the target article transport vehicle 3T.

Next, the control states of the transport vehicle control system 15 will be described.

As shown in FIG. 4, in the first state, the first storage unit 25 transmits the first transport information received from the low-order management device 14 to the first instruction unit 27 and the second instruction unit 28, transmits the device information received from the first instruction unit 27 to the low-order management device 14, and furthermore stores the first transport information and the device information. Also, in the first state, the first instruction unit 27 transmits the second transport information to the target article transport vehicle 3T based on the device information and the first transport information, and transmits the device information received from the article transport vehicles 3 to the first storage unit 25.

Also, in the first state, if the second storage unit 26 is operating normally, the device information and the first transport information are transmitted to the second storage unit 26, and storage unit information is stored in common in the first storage unit 25 and the second storage unit 26. More specifically, the first transport information from the low-order management device 14 is received by both the first storage unit 25 and the second storage unit 26, and the device information from the first instruction unit 27 is transmitted by the first storage unit 25 to the second storage unit 26, and therefore the first transport information and the device information are stored in common in the first storage unit 25 and the second storage unit 26. In this way, storage unit information (information including the first transport information and the device information) is stored in common in the first storage unit 25 and the second storage unit 26. Note that when the first transport information is transmitted to the second storage unit 26, instead of direct transmission from the low-order management device 14, the first transport information received by the first storage unit 25 may be transmitted by the first storage unit 25 to the second storage unit 26.

Also, in the first state, if the second instruction unit 28 is operating normally, the first transport information, the device information, and information regarding the target article transport vehicle 3T are transmitted to the second instruction unit 28, and instruction information is stored in common in the first instruction unit 27 and the second instruction unit 28. More specifically, the first transport information from the first storage unit 25 is received by both the first instruction unit 27 and the second instruction unit 28, and the device information from the article transport vehicles 3 and the information regarding the target article transport vehicle 3T are transmitted by the first instruction unit 27 to the second instruction unit 28, and thus the first transport information, the device information, and the information regarding the target article transport vehicle 3T are stored in common in the first instruction unit 27 and the second instruction unit 28. In this way, instruction unit information (information including the first transport information, the device information, and information regarding the target article transport vehicle 3T) is stored in common in the first instruction unit 27 and the second instruction unit 28. Note that when the first transport information is transmitted to the second instruction unit 28, instead of direct transmission from the first storage unit 25, the first transport information received by the first instruction unit 27 may be transmitted by the first instruction unit 27 to the second instruction unit 28.

In this way, in the transport vehicle control system 15 in the first state, the first storage unit 25 serves as the main storage unit (denoted as "Master" in FIG. 4), the first instruction unit 27 serves as the instruction-giving instruction unit (denoted as "In" in FIG. 4), and various types of information are exchanged between the transport vehicle control system 15 and the low-order management device 14 and the article transport vehicles 3 with use of the first storage unit 25 (main storage unit) and the first instruction unit 27 (instruction-giving instruction unit). Also, in the transport vehicle control system 15 in the first state, if the second storage unit 26 is operating normally, the second storage unit 26 serves as the sub storage unit (denoted as "Shadow" in FIG. 4), and storage unit information is stored in common in the first storage unit 25 (main storage unit) and the second storage unit 26 (sub storage unit). Also, in the transport vehicle control system 15 in the first state, if the second instruction unit 28 is operating normally, the second instruction unit 28 serves as a non-instruction-giving instruction unit (denoted as "Out" in FIG. 4), and instruction unit information is stored in common in the first instruction unit 27 (instruction-giving instruction unit) and the second instruction unit 28 (non-instruction-giving instruction unit).

As shown in FIG. 6, in the second state, the roles of the first instruction unit 27 and the second instruction unit 28 are switched from those in the first state. Specifically, in the transport vehicle control system 15 in the second state, the first storage unit 25 serves as the main storage unit, the second instruction unit 28 serves as the instruction-giving instruction unit, and various types of information are exchanged between the transport vehicle control system 15 and the low-order management device 14 and the article transport vehicles 3 with use of the first storage unit 25 (main storage unit) and the second instruction unit 28 (instruction-giving instruction unit). Also, in the transport vehicle control system 15 in the second state, if the second storage unit 26 is operating normally, the second storage unit 26 serves as the sub storage unit, and storage unit information is stored in common in the first storage unit 25 (main storage unit) and the second storage unit 26 (sub storage unit). Also, in the transport vehicle control system 15 in the second state, if the first instruction unit 27 is operating normally, the first instruction unit 27 serves as the non-instruction-giving instruction unit, and instruction unit information is stored in common in the second instruction unit 28 (instruction-giving instruction unit) and the first instruction unit 27 (non-instruction-giving instruction unit).

As shown in FIG. 8, in the third state, the roles of the first storage unit 25 and the second storage unit 26 are switched from those in the first state. Specifically, in the transport vehicle control system 15 in the third state, the second storage unit 26 serves as the main storage unit, the first instruction unit 27 serves as the instruction-giving instruction unit, and various types of information are exchanged between the transport vehicle control system 15 and the low-order management device 14 and the article transport vehicles 3 with use of the second storage unit 26 (main storage unit) and the first instruction unit 27 (instruction-giving instruction unit). Also, in the transport vehicle control system 15 in the third state, if the first storage unit 25 is operating normally, the first storage unit 25 serves as the sub storage unit, and storage unit information is stored in common in the second storage unit 26 (main storage unit) and the first storage unit 25 (sub storage unit). Moreover, in the transport vehicle control system 15 in the third state, if the second instruction unit 28 is operating normally, the second instruction unit 28 serves as the non-instruction-giving instruction unit, and instruction unit information is stored in common in the first instruction unit 27 (instruction-giving instruction unit) and the second instruction unit 28 (non-instruction-giving instruction unit).

As shown in FIG. 10, in the fourth state, the roles of the first instruction unit 27 and the second instruction unit 28 and the roles of the first storage unit 25 and the second storage unit 26 are switched from those in the first state. Specifically, in the transport vehicle control system 15 in the fourth state, the second storage unit 26 serves as the main storage unit, the second instruction unit 28 serves as the instruction-giving instruction unit, and various types of information are exchanged between the transport vehicle control system 15 and the low-order management device 14 and the article transport vehicles 3 with use of the second storage unit 26 (main storage unit) and the second instruction unit 28 (instruction-giving instruction unit). Also, in the transport vehicle control system 15 in the fourth state, if the first storage unit 25 is operating normally, the first storage unit 25 serves as the sub storage unit, and storage unit information is stored in common in the second storage unit 26 (main storage unit) and the first storage unit 25 (sub storage unit). Moreover, in the transport vehicle control system 15 in the fourth state, if the first instruction unit 27 is operating normally, the first instruction unit 27 serves as the non-instruction-giving instruction unit, and instruction unit information is stored in common in the second instruction unit (instruction-giving instruction unit) and the first instruction unit 27 (non-instruction-giving instruction unit).

Next, the case where the first instruction unit 27 has stopped operating normally in the first state will be described.

Figure 5:
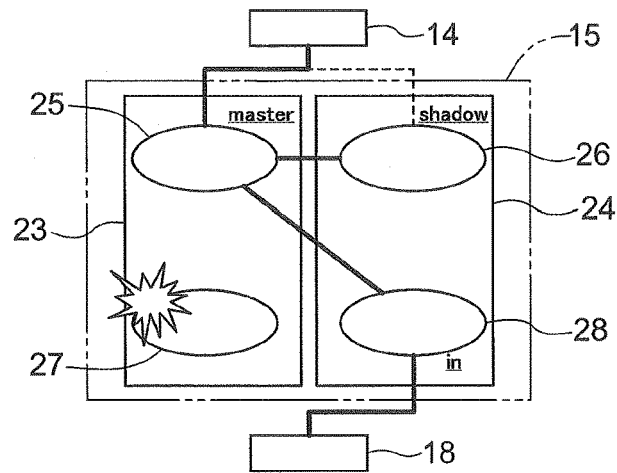
FIG. 5 is a diagram showing the transport vehicle control system in a state where an abnormality has occurred in a first instruction unit.

In the transport vehicle control system 15, in the first state, if the first storage unit 25 determines that the first instruction unit 27 stopped operating normally, the instruction-giving instruction unit is switched from the first instruction unit 27 to the second instruction unit 28, and the control state of the transport vehicle control system 15 is switched to the second state, as shown in FIG. 5.

In this way, the control state of the transport vehicle control system 15 is the first state while the first storage unit 25 and the first instruction unit 27 are operating normally, and is switched to the second state in the case where the first instruction unit 27 stopped operating normally in the first state but the second instruction unit 28 is operating normally. Also, in the second state, the first storage unit 25 transmits the first transport information to the second instruction unit 28, and the second instruction unit 28 transmits the second transport information to the target article transport vehicle 3T based on at least any of the first transport information, the device information, and the instruction unit information. Specifically, the second instruction unit 28 transmits the second transport information to the target article transport vehicle 3T based on the instruction unit information stored in common in the first state, or based on the first transport information and the device information received after a switch to the second state.

When the second transport information is transmitted to the target article transport vehicle 3T, there are cases where initially after the control state of the transport vehicle control system 15 switches from the first state to the second state, the second instruction unit 28 has not received new first transport information and device information after the switch to the second state, and in this case, the second instruction unit 28 selects a target article transport vehicle 3T based on only the instruction unit information that was stored in common in the first state, and transmits the second transport information to the target article transport vehicle 3T. After the control state of the transport vehicle control system 15 switches from the first state to the second state, if the second instruction unit 28 has received first transport information and device information that enable selecting a target article transport vehicle 3T and transmitting the second transport information to the target article transport vehicle 3T, the second instruction unit 28 selects a target article transport vehicle 3T based on the first transport information and the device information that were received after the switch to the second state, and transmits the second transport information to the target article transport vehicle 3T.

Next, the case where the first storage unit 25 has stopped operating normally in the first state will be described.

Figure 7:
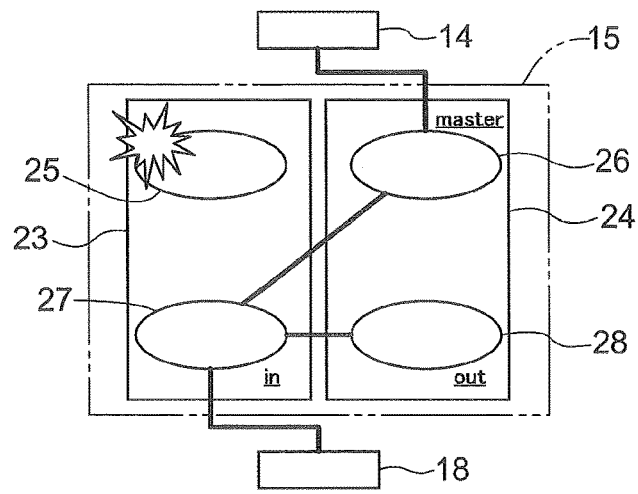
FIG. 7 is a diagram showing the transport vehicle control system in a state where an abnormality has occurred in a first storage unit.

In the transport vehicle control system 15, in the first state, if the second storage unit 26 determines that the first storage unit 25 stopped operating normally, the main storage unit is switched from the first storage unit 25 to the second storage unit 26, and the control state of the transport vehicle control system 15 is switched to the third state, as shown in FIG. 7.

In this way, the control state of the transport vehicle control system 15 is the first state while the first storage unit 25 and the first instruction unit 27 are operating normally, and is switched to the third state in the case where the first storage unit 25 stopped operating normally in the first state but the second storage unit 26 is operating normally. Also, in the third state, the second storage unit 26 transmits the first transport information to the first instruction unit 27 based on at least any of the first transport information and the storage unit information, and the first instruction unit 27 transmits the second transport information to the target article transport vehicle 3T based on the device information and the first transport information. Specifically, the second storage unit 26 transmits the first transport information to the first instruction unit 27 based on the storage unit information stored in common in the first state or based on the first transport information received after the switch to the third state.

When the second transport information is transmitted to the target article transport vehicle 3T, there are cases where initially after the control state of the transport vehicle control system 15 switches from the first state to the third state, even though the first storage unit 25 has received the first transport information from the low-order management device 14 in the first state, the first storage unit 25 has not transmitted that first transport information to the first instruction unit 27, and in this case, the second storage unit 26 transmits the first transport information to the first instruction unit 27 based on only the storage unit information that was stored in common in the first state. After the control state of the transport vehicle control system 15 switches from the first state to the third state, if the second storage unit 26 receives new first transport information, the second storage unit 26 transmits the first transport information to the first instruction unit 27 based on the first transport information.

Next, the case where both the first storage unit 25 and the first instruction unit 27 have stopped operating normally in the first state will be described.

Figure 9:
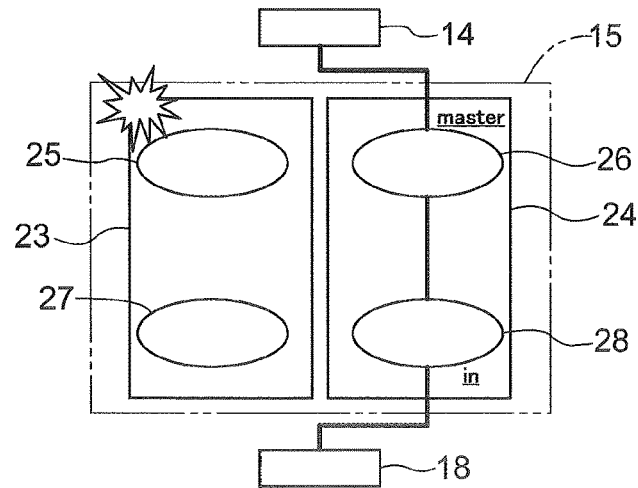
FIG. 9 is a diagram showing the transport vehicle control system in a state where an abnormality has occurred in both the first storage unit and the first instruction unit.

In the transport vehicle control system 15, in the first state, if the second storage unit 26 determines that both the first instruction unit 27 and the first storage unit 25 have stopped operating normally, the instruction-giving instruction unit is switched from the first instruction unit 27 to the second instruction unit 28, the main storage unit is switched from the first storage unit 25 to the second storage unit 26, and the control state of the transport vehicle control system 15 is switched to the fourth state, as shown in FIG. 9.

In this way, the control state of the transport vehicle control system 15 is the first state if the first storage unit 25 and the first instruction unit 27 are operating normally, and is switched to the fourth state in the case where both the first instruction unit 27 and the first storage unit 25 stopped operating normally in the first state, but the second instruction unit 28 and the second storage unit 26 are operating normally. Also, in the fourth state, the second storage unit 26 transmits the first transport information to the second instruction unit 28 based on at least any of the first transport information and the storage unit information, and the second instruction unit 28 transmits the second transport information to the target article transport vehicle 3T based on at least any of the first transport information, the device information, and the instruction unit information. Specifically, the second storage unit 26 transmits the first transport information to the second instruction unit 28 based on the storage unit information stored in common in the first state or based on the first transport information received after the switch to the fourth state. Also, the second instruction unit 28 transmits the second transport information to the target article transport vehicle 3T based on the instruction unit information stored in common in the first state, or based on the first transport information and the device information received after a switch to the fourth state.

Next, the case of updating the first storage unit 25 and the second storage unit 26 in the first state will be described with reference to FIGS. 16 to 20. Updating of the first storage unit 25 and the second storage unit 26 is started by, for example, connecting a terminal for updating to the transport vehicle control system 15 and then operating that terminal.

In the case of updating the first storage unit 25 and the second storage unit 26 in the first state, the transport vehicle control system 15 performs first update processing, operation check processing that follows the first update processing, second update processing, and operation check processing that follows the second update processing, as described below.

Figure 16:
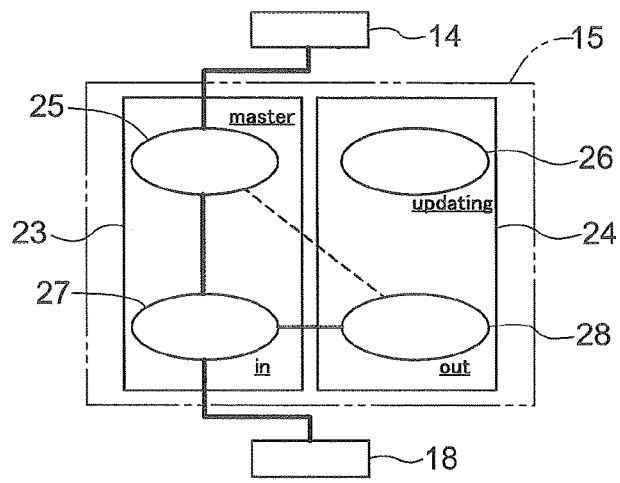
FIG. 16 is a diagram showing the transport vehicle control system during updating of a second storage unit.

As shown in FIG. 16, in the first update processing, communication between the second storage unit 26 and the low-order management device 14 and first storage unit 25 is cut off, and the second storage unit 26 is updated. In other words, while the first update processing is executed, information is not exchanged between the second storage unit 26 and the low-order management device 14 and first storage unit 25.

Figure 17:
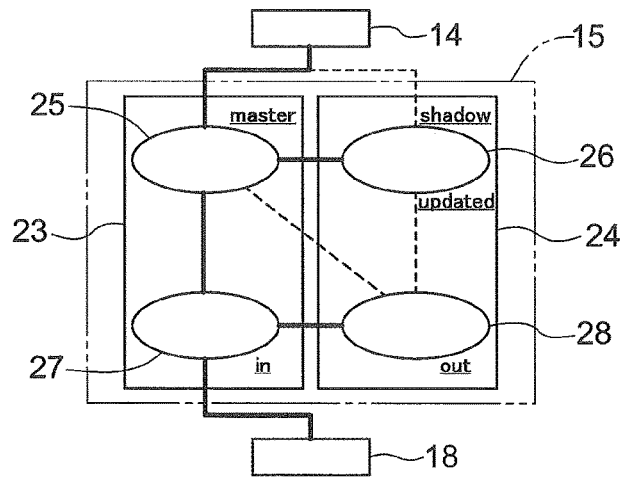
FIG. 17 is a diagram showing the transport vehicle control system after updating of the second storage unit.

Then, as shown in FIG. 17, after the first update processing is complete, information (device information and the like) is transmitted from the first storage unit 25 to the second storage unit 26, and storage unit information is stored in common in the first storage unit 25 and the second storage unit 26. Thereafter, operation check processing is performed on the second storage unit 26 and the second instruction unit 28 by causing the second storage unit 26 and the second instruction unit 28 to operate in parallel with the operation of the first storage unit 25 and the first instruction unit 27. In the operation check processing that follows the first update processing, information such as the device information and the first transport information is exchanged between the second storage unit 26 and the second instruction unit 28, and the second storage unit 26 and the second instruction unit 28 are caused to operate in order to check whether the second storage unit 26 and the second instruction unit 28 are operating normally.

In the transport vehicle control system 15, if both the second storage unit 26 and the second instruction unit 28 operate without a problem occurring in the operation check processing that follows the first update processing, the control state is switched from the first state to the third state, and then the second update processing is performed.

Figure 18:
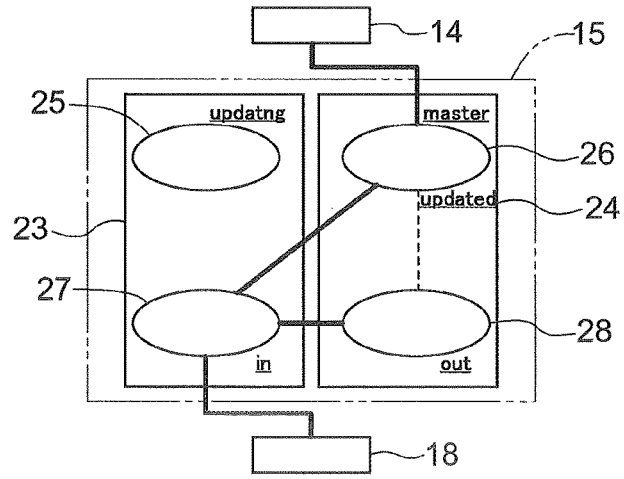
FIG. 18 is a diagram showing the transport vehicle control system during updating of the first storage unit.

As shown in FIG. 18, in the second update processing, communication between the first storage unit 25 and the low-order management device 14 and second storage unit 26 is cut off, and the first storage unit 25 is updated. In other words, while the second update processing is executed, information is not exchanged between the first storage unit 25 and the low-order management device 14 and second storage unit 26.

Figure 19:
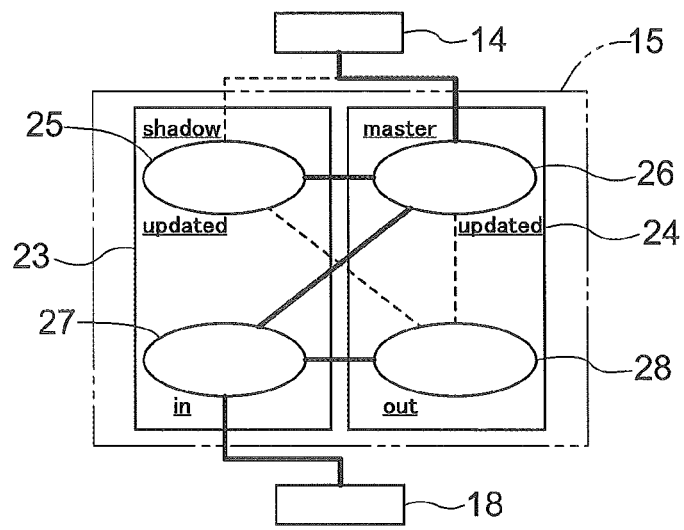
FIG. 19 is a diagram showing the transport vehicle control system after updating of the first storage unit.
Figure 20:
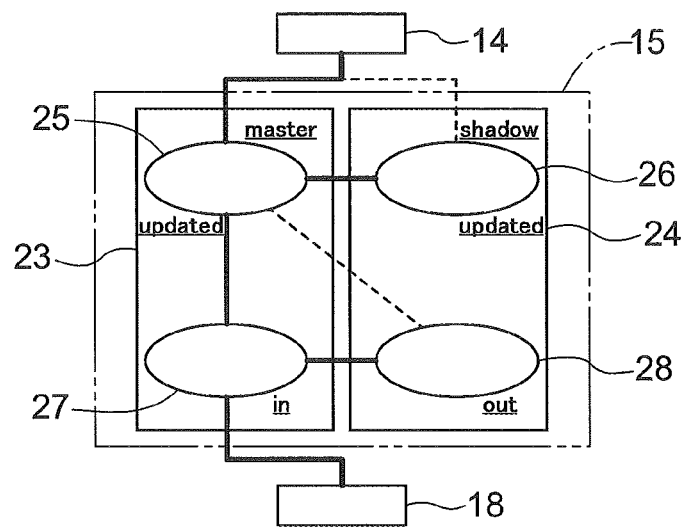
FIG. 20 is a diagram showing the transport vehicle control system after a switch to the first state after updating.

Then, as shown in FIG. 19, after the second update processing is complete, information (the first transport information and the like) is transmitted from the second storage unit 26 to the first storage unit 25, and storage unit information is stored in common in the first storage unit 25 and the second storage unit 26, and thereafter the operation check processing is performed on the first storage unit 25 and the second instruction unit 28 in parallel with the operation of the second storage unit 26 and the first instruction unit 27, and after this operation check processing is complete, the control state returns to the first state as shown in FIG. 20. In the operation check processing that follows the second update processing, information such as the device information and the first transport information is exchanged between the first storage unit 25 and the second instruction unit 28, and the first storage unit 25 and the second instruction unit 28 are caused to operate in order to check whether the first storage unit 25 and the second instruction unit 28 are operating normally.

Next, the case of updating the first instruction unit 27 and the second instruction unit 28 in the first state will be described with reference to FIGS. 11 to 15. Updating of the first instruction unit 27 and the second instruction unit 28 is started by, for example, connecting a terminal for updating to the transport vehicle control system 15 and then operating that terminal.

In the case of updating the first instruction unit 27 and the second instruction unit 28 in the first state, the transport vehicle control system 15 performs third update processing, operation check processing that follows the third update processing, fourth update processing, and operation check processing that follows the fourth update processing, as described below.

Figure 11:
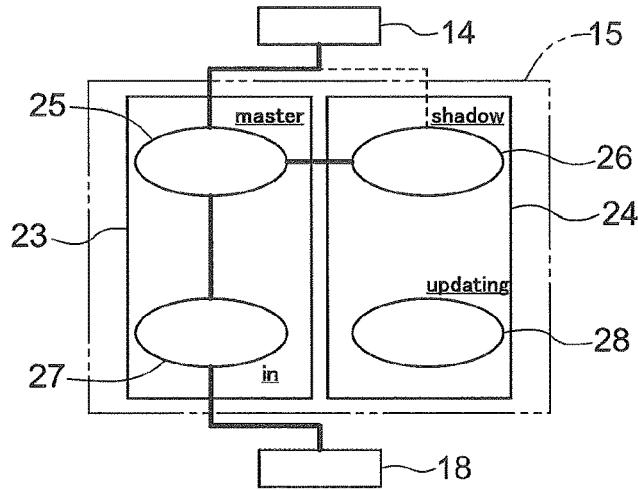
FIG. 11 is a diagram showing the transport vehicle control system during updating of a second instruction unit.

As shown in FIG. 11, in the third update processing, communication between the second instruction unit 28 and the first storage unit 25 and first instruction unit 27 is cut off, and the second instruction unit 28 is updated. In other words, while the third update processing is executed, information is not exchanged between the second instruction unit 28 and the first storage unit 25 and first instruction unit 27.

Figure 12:
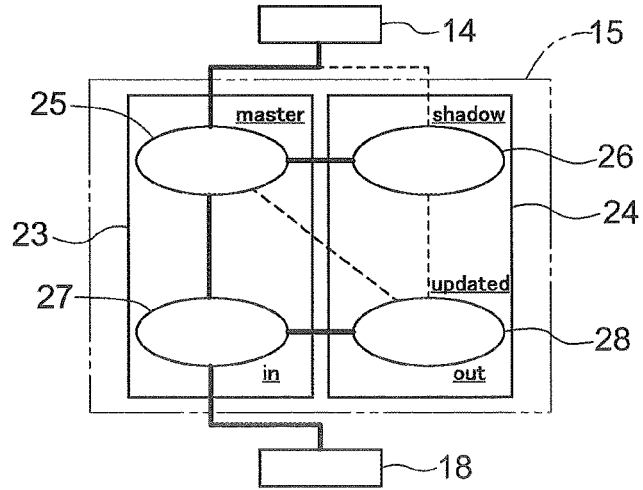
FIG. 12 is a diagram showing the transport vehicle control system after updating of the second instruction unit.

Then, as shown in FIG. 12, after the third update processing is complete, information is transmitted from the first instruction unit 27 to the second instruction unit 28, and instruction unit information is stored in common in the first instruction unit 27 and the second instruction unit 28. Thereafter, operation check processing is performed on the second storage unit 26 and the second instruction unit 28 by causing the second storage unit 26 and the second instruction unit 28 to operate in parallel with the operation of the first storage unit 25 and the first instruction unit 27. In the operation check processing that follows the third update processing, information such as the device information and the first transport information is exchanged between the second storage unit 26 and the second instruction unit 28, and the second storage unit 26 and the second instruction unit 28 are caused to operate in order to check whether the second storage unit 26 and the second instruction unit 28 are operating normally.

In the transport vehicle control system 15, if both the second storage unit 26 and the second instruction unit 28 operate without a problem occurring in the operation check processing that follows the third update processing, the control state is switched from the first state to the second state, and then the fourth update processing is performed.

Figure 13:
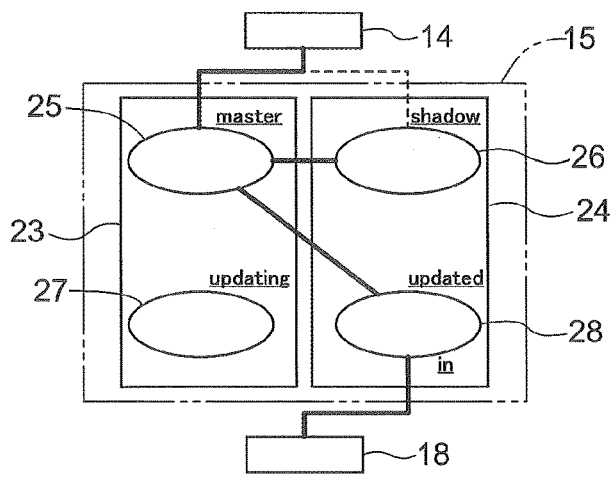
FIG. 13 is a diagram showing the transport vehicle control system during updating of the first instruction unit.

As shown in FIG. 13, in the fourth update processing, communication between the first instruction unit 27 and the first storage unit 25 and second instruction unit 28 is cut off, and the first instruction unit 27 is updated. In other words, while the fourth update processing is executed, information is not exchanged between the first instruction unit 27 and the first storage unit 25 and second instruction unit 28.

Figure 14:
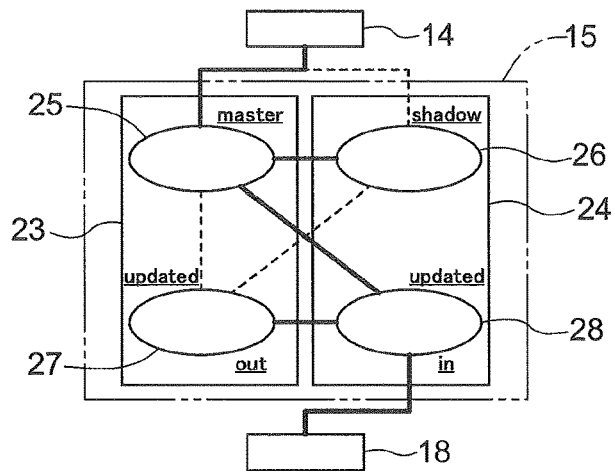
FIG. 14 is a diagram showing the transport vehicle control system after updating of the first instruction unit.
Figure 15:
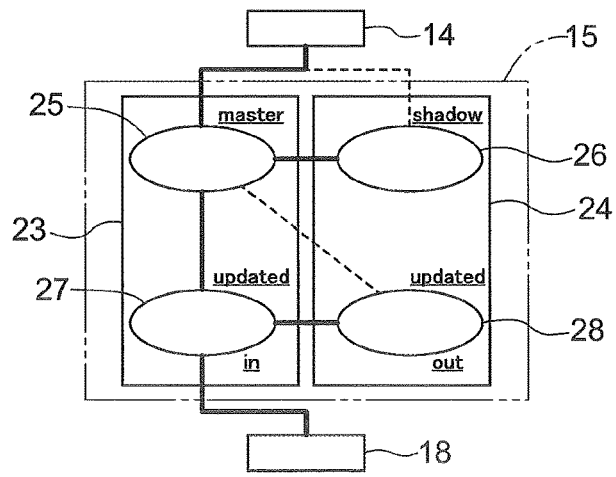
FIG. 15 is a diagram showing the transport vehicle control system after a switch to the first state after updating.

Then, as shown in FIG. 14, after the fourth update processing is complete, information is transmitted from the second instruction unit 28 to the first instruction unit 27, and instruction unit information is stored in common in the first instruction unit 27 and the second instruction unit 28, and thereafter operation check processing is performed on the second storage unit 26 and the first instruction unit 27 in parallel with the operation of the first storage unit 25 and the second instruction unit 28, and after this operation check processing is complete, the control state returns to the first state as shown in FIG. 15. In the operation check processing that follows the fourth update processing, information such as the device information and the first transport information is exchanged between the second storage unit 26 and the first instruction unit 27, and the second storage unit 26 and the first instruction unit 27 are caused to operate in order to check whether the second storage unit 26 and the first instruction unit 27 are operating normally.

2. Other Embodiments

Next, other embodiments of the article transport facility will be described.

(1) In the above embodiment, in the first state, if the first instruction unit 27 stops operating normally, the transport vehicle control system 15 switches from the first state to the second state, and then maintains the second state even if the first instruction unit 27 starts to operate normally, but the transport vehicle control system 15 may switch from the first state to the second state, and then return to the first state when the first instruction unit 27 starts to operate normally.

Also, similarly, the transport vehicle control system 15 may switch from the first state to the third state, and then return to the first state when the first storage unit 25 starts to operate normally. Furthermore, the transport vehicle control system 15 may switch from the first state to the fourth state, and then return to the first state when the first storage unit 25 and the first instruction unit 27 start to operate normally.

(2) In the above embodiment, the control state returns to the first state after updating of the first storage unit 25 and the second storage unit 26 is complete, but it is not necessary to return to the first state after updating of the first storage unit 25 and the second storage unit 26 is complete. Also, in the above embodiment, the control state returns to the first state after updating of the first instruction unit 27 and the second instruction unit 28 is complete, but it is not necessary to return to the first state after updating of the first instruction unit 27 and the second instruction unit 28 is complete.

(3) In the above embodiment, operation check processing is performed on the second storage unit 26 and the second instruction unit 28 in the operation check processing that follows first update processing, but operation check processing may be performed on only the updated second storage unit 26 in the operation check processing that follows first update processing.

Also, in the above embodiment, operation check processing is performed on the first storage unit 25 and the second instruction unit 28 in the operation check processing that follows second update processing, but operation check processing may be performed on only the updated first storage unit 25 in the operation check processing that follows second update processing.

Furthermore, in the above embodiment, operation check processing is performed on the second storage unit 26 and the second instruction unit 28 in the operation check processing that follows third update processing, but operation check processing may be performed on only the updated second instruction unit 28 in the operation check processing that follows third update processing.

Moreover, in the above embodiment, operation check processing is performed on the second storage unit 26 and the first instruction unit 27 in the operation check processing that follows fourth update processing, but operation check processing may be performed on only the updated first instruction unit 27 in the operation check processing that follows fourth update processing.

(4) Note that the configurations disclosed in the embodiments described above can be applied in combination with the configurations of other embodiments as long as no contradiction arises. Regarding other configurations as well, the embodiments disclosed in the present specification are merely illustrative in all respects. Accordingly, various improvements can be made as appropriate without departing from the gist of the present disclosure.

3. Summary of Above Embodiments

The following describes a summary of the article transport facility described above.

An article transport facility according to one aspect of the present disclosure includes: a control system that controls a plurality of transport devices that transport an article, wherein the control system is mechanically separated from a management device and includes a first server and a second server that transmit second transport information to the plurality of transport devices based on first transport information from the management device, the first server includes a first storage unit and a first instruction unit, the second server is mechanically separated from the first server and includes a second storage unit and a second instruction unit, the first storage unit is configured to be capable of receiving the first transport information from the management device and storing the first transport information, and transmitting the first transport information to the first instruction unit and the second instruction unit, the second storage unit is configured to be capable of receiving the first transport information from the management device and storing the first transport information, and transmitting the first transport information to the first instruction unit and the second instruction unit, the first instruction unit is configured to be capable of selecting a target transport device from among the plurality of transport devices based on the first transport information from the first storage unit or the second storage unit and device information indicating statuses of the plurality of transport devices, and transmitting the second transport information to the target transport device, the second instruction unit is configured to be capable of selecting the target transport device based on the first transport information and the device information, and transmitting the second transport information to the target transport device, a control state of the control system includes a first state in which based on the first transport information received by the first storage unit, out of the first instruction unit and the second instruction unit, the first instruction unit transmits the second transport information to the target transport device, and a second state in which based on the first transport information received by the first storage unit, out of the first instruction unit and the second instruction unit, the second instruction unit transmits the second transport information to the target transport device, in a state where the first storage unit and the first instruction unit are operating normally, the control state is the first state, and in a case where the first instruction unit stops operating normally in the first state but the second instruction unit is operating normally, the control state is switched to the second state, in the first state, the first storage unit transmits the first transport information to the first instruction unit, the first instruction unit transmits the second transport information to the target transport device based on the device information and the first transport information, and the device information and the first transport information are transmitted to the second instruction unit, and thus instruction unit information is stored in common in the first instruction unit and the second instruction unit, and in the second state, the first storage unit transmits the first transport information to the second instruction unit, and the second instruction unit transmits the second transport information to the target transport device based on the instruction unit information.

According to this configuration, in the control system in the first state, the first storage unit transmits the first transport information received from the management device to the first instruction unit, and the first instruction unit can select the target transport device from among the plurality of transport devices based on the first transport information from the first storage unit and the device information that indicates the statuses of the transport devices, and transmit the second transport information to the target transport device. Also, in the control system in the first state, the device information and the first transport information are transmitted to the second instruction unit as well, and therefore the instruction unit information (information including the device information and the first transport information) can be stored in common in the first instruction unit and the second instruction unit.

Also, if an abnormality occurs in the first instruction unit while the control system is operating in the first state, the control state of the control system is switched from the first state to the second state, and thus the second instruction unit transmits the second transport information to the target transport device based on the instruction unit information. In other words, as described above, even if an abnormality occurs in the first instruction unit, the second instruction unit can transmit the second transport information to the target transport device, thus making it possible to avoid a stop in article transport by the transport devices.

Also, in the control system, first transport information can be received from the management device both when the control state is in the first state and when it is in the second state, thus making it possible to avoid an increase in the load on the management device caused when first transport information that is to be transmitted to the control system accumulates in the management device.

It should be noted that there are cases where initially after the control state of the control system switches from the first state to the second state, the second instruction unit has not received new first transport information and device information after the switch to the second state, and in this case, the second instruction unit can select a target article transport vehicle based on the instruction unit information that was stored in common in the first state, and transmit the second transport information to the target article transport vehicle.

After the control state of the control system switches from the first state to the second state, if the second instruction unit has received first transport information and device information that enable selecting a target article transport vehicle and transmitting the second transport information to the target article transport vehicle, similarly to the first instruction unit in the first state, the second instruction unit can select a target article transport vehicle based on the first transport information and the device information that were received after the switch to the second state, and transmit the second transport information to the target article transport vehicle.

Here, it is preferable that the control state of the control system further includes a third state in which based on the first transport information received by the second storage unit, out of the first instruction unit and the second instruction unit, the first instruction unit transmits the second transport information to the target transport device, in a case where the first storage unit stops operating normally in the first state but the second storage unit is operating normally, the control state is switched to the third state, in the first state, the first transport information is transmitted to the second storage unit, and thus storage unit information is stored in common in the first storage unit and the second storage unit, and in the third state, the second storage unit transmits the first transport information to the first instruction unit based on the storage unit information, and the first instruction unit transmits the second transport information to the target transport device based on the device information and the first transport information.

According to this configuration, in the control system in the first state, the first transport information is transmitted to the second storage unit as well, and thus the storage unit information that includes the first transport information can be stored in common in the first storage unit and the second storage unit.

If an abnormality occurs in the first storage unit while the control system is operating in the first state, the control state of the control system is switched from the first state to the third state, and thus the second storage unit can transmit the first transport information to the first instruction unit based on the storage unit information, and the first instruction unit can transmit the second transport information to the target transport device based on the device information and the first transport information. In other words, as described above, even if an abnormality occurs in the first storage unit, the second storage unit can transmit the first transport information to the first instruction unit, thus making it possible to avoid a stop in article transport by the transport devices.

Also, in the control system, first transport information can be received from the management device even if the control state is the third state, thus making it possible to avoid an increase in the load on the management device caused when first transport information that is to be transmitted to the control system accumulates in the management device.

Also, it is preferable that the control system performs first update processing in the first state, and in the first update processing, communication between the second storage unit and the management device and the first storage unit is cut off, and the second storage unit is updated, and then after the first update processing is complete, information is transmitted from the first storage unit to the second storage unit, and thus the storage unit information is stored in common in the first storage unit and the second storage unit, and thereafter operation check processing is performed on the second storage unit and the second instruction unit by causing the second storage unit and the second instruction unit to operate in parallel with operation of the first storage unit and the first instruction unit.

According to this configuration, when the first update processing is performed in the first state, the second storage unit can be updated while communication between the second storage unit and the management device and first storage unit is cut off. By performing the first update processing in this way, the second storage unit can be updated without influencing the first storage unit that receives the first transport information and the first instruction unit that transmits the second transport information.

Also, after the first update processing is complete, the storage unit information is stored in common in the first storage unit and the second storage unit, and thereafter operation check processing is performed on the second storage unit and the second instruction unit by causing the second storage unit and the second instruction unit to operate in parallel with operation of the first storage unit and the first instruction unit, and therefore the operation check performed on the second storage unit and the operation check performed during communication between the second storage unit and the second instruction unit can be performed without influencing the first storage unit that receives the first transport information and the first instruction unit that transmits the second transport information.

Also, it is preferable that if no problem occurs in the operation check processing that follows the first update processing, the control system switches from the first state to the third state, and then performs second update processing, and in the second update processing, communication between the first storage unit and the management device and the second storage unit is cut off, and the first storage unit is updated, and then after the second update processing is complete, information is transmitted from the second storage unit to the first storage unit, and thus the storage unit information is stored in common in the first storage unit and the second storage unit, and thereafter operation check processing is performed on the first storage unit and the second instruction unit in parallel with operation of the second storage unit and the first instruction unit, and then after the operation check processing is complete, the control state returns to the first state.

According to this configuration, when the second update processing is performed in the third state, the first storage unit can be updated while communication between the first storage unit and the management device and second storage unit is cut off. By performing the second update processing in this way, the first storage unit can be updated without influencing the second storage unit that receives the first transport information and the first instruction unit that transmits the second transport information.

Also, after the second update processing is complete, the storage unit information is stored in common in the first storage unit and the second storage unit, and thereafter operation check processing is performed on the first storage unit and the second instruction unit by causing the first storage unit and the second instruction unit to operate in parallel with operation of the second storage unit and the first instruction unit, and therefore the operation check performed on the first storage unit and the operation check performed during communication between the first storage unit and the second instruction unit can be performed without influencing the second storage unit that receives the first transport information and the first instruction unit that transmits the second transport information.

Also, it is preferable that in addition to the first state, the second state, and the third state, the control state of the control system further includes a fourth state in which based on the first transport information received by the second storage unit, out of the first instruction unit and the second instruction unit, the second instruction unit transmits the second transport information to the target transport device, in a case where the first storage unit and the first instruction unit both stop operating normally in the first state but the second storage unit and the second instruction unit are operating normally, the control state is switched to the fourth state, and in the fourth state, the second storage unit transmits the first transport information to the second instruction unit based on the storage unit information, and the second instruction unit transmits the second transport information to the target transport device based on the instruction unit information.

According to this configuration, if an abnormality occurs in both the first storage unit and the first instruction unit while the control system is operating in the first state, the control state of the control system is switched from the first state to the fourth state, and thus the second storage unit can transmit the first transport information to the second instruction unit based on the storage unit information, and the second instruction unit can transmit the second transport information to the target transport device based on the instruction unit information. In other words, as described above, even if an abnormality occurs in both the first storage unit and the first instruction unit, the second storage unit can transmit the first transport information to the second instruction unit, and the second instruction unit can transmit the second transport information to the target transport device, thus making it possible to avoid a stop in article transport by the transport devices.

Also, in the control system, first transport information can be received from the management device even if the control state is the fourth state, thus making it possible to avoid an increase in the load on the management device caused when first transport information that is to be transmitted to the control system accumulates in the management device.

Also, it is preferable that the plurality of transport devices are ceiling transport vehicles that transport articles by traveling along a traveling rail disposed in a vicinity of a ceiling, and the first transport information and the second transport information are information indicating a transport source and a transport destination for article transport by the ceiling transport vehicles.

According to this configuration, even if an abnormality occurs in the first instruction unit, the second transport information that indicates the transport source and the transport destination can be transmitted to a ceiling transport vehicle, and therefore the ceiling transport vehicle can transport an article from the transport source to the transport destination based on the second transport information, thus making it possible to avoid a stop in article transport by the ceiling transport vehicle.

The technology according to the present disclosure is applicable to an article transport facility that includes a control system for controlling transport devices that transport articles.

What is claimed is:

1. An article transport facility comprising:
  a control system that controls a plurality of transport devices, wherein each of the transport devices transports an article;
  wherein:
  the control system is mechanically separated from a management device, and the control system comprises a first server and a second server that transmit second transport information to the plurality of transport devices;
  the second transport information is transmitted to the transport devices based on first transport information received from the management device;
  the first server comprises a first storage unit and a first instruction unit;
  the second server is mechanically separated from the first server and comprises a second storage unit and a second instruction unit;
  the first storage unit is configured to:
  receive the first transport information from the management device and store the first transport information, the first transport information indicating an article transport source and transport destination; and
  transmit the first transport information to the first instruction unit and the second instruction unit;
  the second storage unit is configured to:
  receive the first transport information from the management device and store the first transport information and
  transmit the first transport information to the first instruction unit and the second instruction unit, wherein, the first instruction unit is configured to:
  select a target transport device from the plurality of transport devices based on the first transport information from the first storage unit or the second storage unit and device information, the device information indicating statuses of the plurality of transport devices, and transmit the second transport information to the target transport device;
  wherein the second instruction unit is configured to:
  select the target transport device based on the first transport information and the device information, and
  transmit the second transport information to the target transport device;
  the control system further comprising a control state, the control state including:
  a first state that is based on the first transport information received by the first storage unit, the first instruction unit transmits the second transport information to the target transport device, and
  a second state that is based on the first transport information received by the first storage unit, the second instruction unit transmits the second transport information to the target transport device;
  wherein the control state is in the first state when the first storage unit and the first instruction unit are operating normally, and when the first instruction unit stops operating normally in the first state and the second instruction unit is operating normally, the control state is switched to the second state;
  wherein in the first state:
  the first storage unit transmits the first transport information to the first instruction unit, the first instruction unit transmits the second transport information to the target transport device based on the device information and the first transport information, and
  the device information and the first transport information are transmitted to the second instruction unit, so that instruction unit information is commonly stored both in the first instruction unit and the second instruction unit; and
  wherein in the second state:
  the first storage unit transmits the first transport information to the second instruction unit, and the second instruction unit transmits the second transport information to the target transport device based on the instruction unit information.

2. The article transport facility according to claim 1, wherein the control state of the control system further includes a third state based on the first transport information received by the second storage unit, the first instruction unit transmits the second transport information to the target transport device;
  wherein when the first storage unit stops operating normally in the first state and the second storage unit is operating normally, the control state is switched to the third state;
  wherein in the first state, the first transport information is transmitted to the second storage unit, so that storage unit information is stored in both the first storage unit and the second storage unit, and wherein in the third state, the second storage unit transmits the first transport information to the first instruction unit based on the storage unit information, and the first instruction unit transmits the second transport information to the target transport device based on the device information and the first transport information.

3. The article transport facility according to claim 2, wherein the control system performs first update processing in the first state;

wherein during the first update processing, communication between the second storage unit and the management device and the first storage unit is cut off, and the second storage unit is updated, and after the first update processing is complete, information is transmitted from the first storage unit to the second storage unit so that the storage unit information is stored in both the first storage unit and the second storage unit; and wherein thereafter, an operation check processing is performed on the second storage unit and the second instruction unit by causing the second storage unit and the second instruction unit to operate in parallel with operation of the first storage unit and the first instruction unit.

4. The article transport facility according to claim 3, wherein if no problem occurs in the operation check processing that follows the first update processing, the control system switches from the first state to the third state, and then performs second update processing, and during the second update processing, communication between the first storage unit and the management device and the second storage unit is cut off, and the first storage unit is updated, and after the second update processing is complete, information is transmitted from the second storage unit to the first storage unit so that the storage unit information is stored in both the first storage unit and the second storage unit; and wherein thereafter, an operation check processing is performed on the first storage unit and the second instruction unit in parallel with operation of the second storage unit and the first instruction unit, and after the operation check processing is complete, the control state returns to the first state.

5. The article transport facility according to claim 2, wherein the control state of the control system further includes a fourth state based on the first transport information received by the second storage unit, the second instruction unit transmits the second transport information to the target transport device;

wherein when the first storage unit and the first instruction unit both stop operating normally in the first state and the second storage unit and the second instruction unit are operating normally, the control state is switched to the fourth state; and wherein, in the fourth state, the second storage unit transmits the first transport information to the second instruction unit based on the storage unit information, and the second instruction unit transmits the second transport information to the target transport device based on the instruction unit information.

6. The article transport facility according to claim 1, wherein the plurality of transport devices are ceiling transport vehicles that transport articles by traveling along a traveling rail disposed in a vicinity of a ceiling, and the first transport information and the second transport information indicate a transport source and a transport destination for the articles transported by the ceiling transport vehicles.

* * * * *